US012625432B2

(12) United States Patent
Fulford et al.

(10) Patent No.: US 12,625,432 B2
(45) Date of Patent: May 12, 2026

(54) METHODS OF FORMING PATTERNS

(71) Applicant: Tokyo Electron Limited, Tokyo (JP)

(72) Inventors: Daniel Fulford, Cohoes, NY (US); Jodi Grzeskowiak, Schenectady, NY (US); H. Jim Fulford, Albany, NY (US); Sean Smith, Cohasset, MA (US); Partha Mukhopadhyay, Orlando, FL (US); Michael Murphy, Albany, NY (US); Anton deVilliers, Clifton Park, NY (US)

(73) Assignee: Tokyo Electron Limited, Tokyo (JP)

( * ) Notice: Subject to any disclaimer, the term of this patent is extended or adjusted under 35 U.S.C. 154(b) by 719 days.

(21) Appl. No.: 17/519,292

(22) Filed: Nov. 4, 2021

(65) Prior Publication Data

US 2023/0052800 A1     Feb. 16, 2023

Related U.S. Application Data

(60) Provisional application No. 63/233,559, filed on Aug. 16, 2021.

(51) Int. Cl.
G03F 7/00 (2006.01)
H10P 76/20 (2026.01)
H10P 76/40 (2026.01)

(52) U.S. Cl.
CPC ...... G03F 7/70191 (2013.01); H10P 76/2041 (2026.01); H10P 76/4088 (2026.01); H10P 76/4085 (2026.01)

(58) Field of Classification Search
CPC ..................... H01L 21/31127; H01L 21/3086
See application file for complete search history.

(56) References Cited

U.S. PATENT DOCUMENTS 5,696,624 A * 12/1997 Komine ................ C03C 4/0085
                                                                359/350
5,759,744 A *  6/1998 Brueck .............. G03F 7/70408
                                                                430/394

(Continued)

FOREIGN PATENT DOCUMENTS

CN          1421745 A      6/2003
JP          H0697024 A     4/1994
WO        2021102006 A1    5/2021

OTHER PUBLICATIONS

International Search Report and Written Opinion, PCT Application No. PCT/US2022/040368, mailed Dec. 1, 2022, 6 pages.

(Continued)

*Primary Examiner* — Thomas T Pham
(74) *Attorney, Agent, or Firm* — Slater Matsil, LLP

(57) ABSTRACT

A method of forming sub-resolution features that includes: exposing a photoresist layer formed over a substrate to a first ultraviolet light (UV) radiation having a first wavelength of 365 nm or longer through a mask configured to form features at a first critical dimension, the photoresist layer including first portions exposed to the first UV radiation and second portions unexposed to the first UV radiation after exposing with the first UV radiation; exposing the first portions and the second portions to a second UV radiation; and developing the photoresist layer after exposing the photoresist layer to the second UV radiation to form the sub-resolution features having a second critical dimension less than the first critical dimension.

19 Claims, 10 Drawing Sheets

(56)  References Cited

U.S. PATENT DOCUMENTS

| | | | | |
|---|---|---|---|---|
| 6,097,361 | A * | 8/2000 | Rohner | G03F 7/70291 |
| | | | | 345/87 |
| 8,492,282 | B2 | 7/2013 | DeVilliers | |
| 9,406,526 | B2 | 8/2016 | deVilliers | |
| 9,645,495 | B2 | 5/2017 | deVilliers | |
| 9,735,067 | B2 | 8/2017 | deVilliers et al. | |
| 9,977,339 | B2 | 5/2018 | deVilliers et al. | |
| 10,061,199 | B2 | 8/2018 | deVilliers | |
| 10,338,466 | B2 | 7/2019 | deVilliers | |
| 2004/0197676 | A1 | 10/2004 | Rau | |
| 2006/0039423 | A1 | 2/2006 | Tokuhisa et al. | |
| 2011/0183269 | A1 * | 7/2011 | Zhu | H01L 21/31138 |
| | | | | 430/323 |
| 2011/0250541 | A1 | 10/2011 | Kozawa et al. | |
| 2013/0155381 | A1 | 6/2013 | Chang | |
| 2014/0272711 | A1 * | 9/2014 | Bristol | G03F 7/0045 |
| | | | | 430/323 |
| 2017/0235228 | A1 | 8/2017 | Chandhok et al. | |

OTHER PUBLICATIONS

Korean Office Action and English translation, Korean Patent Application No. 10-2024-7004985, Feb. 13, 2026, 19 pages.
Singapore Search Report and Written Opinion with English translation, Patent Application No. 1120240056W, Mar. 1, 2026, 10 pages.

* cited by examiner

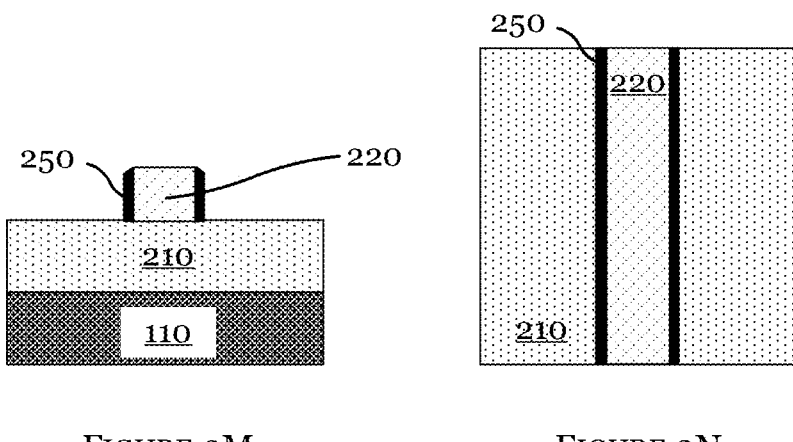
FIGURE 2M                    FIGURE 2N
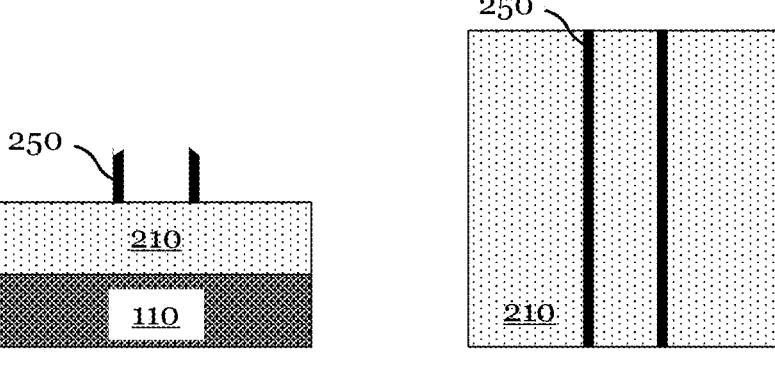
FIGURE 2O                    FIGURE 2P
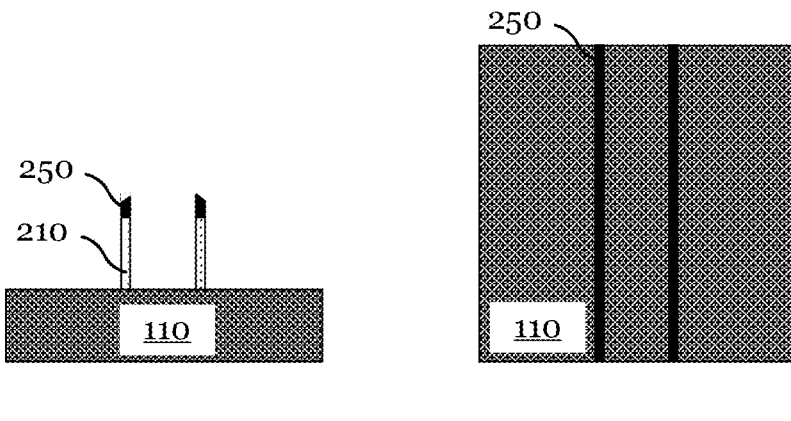
FIGURE 2Q                    FIGURE 2R

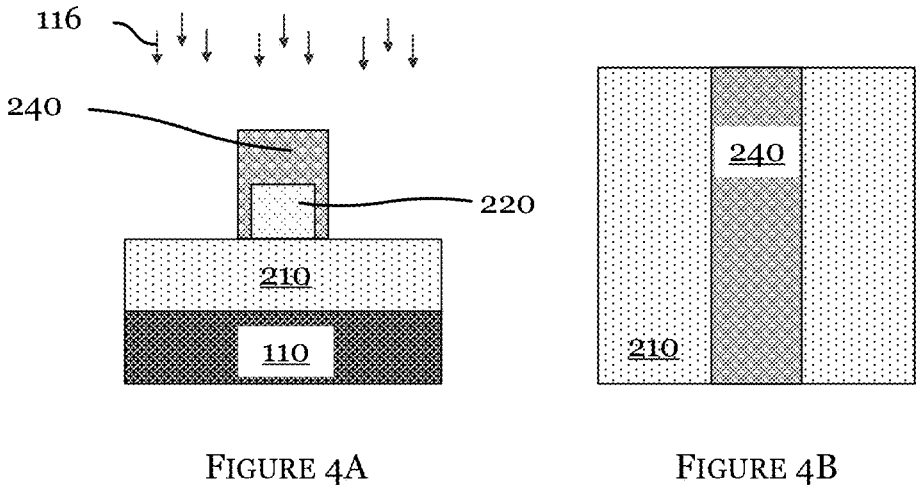
FIGURE 4A FIGURE 4B
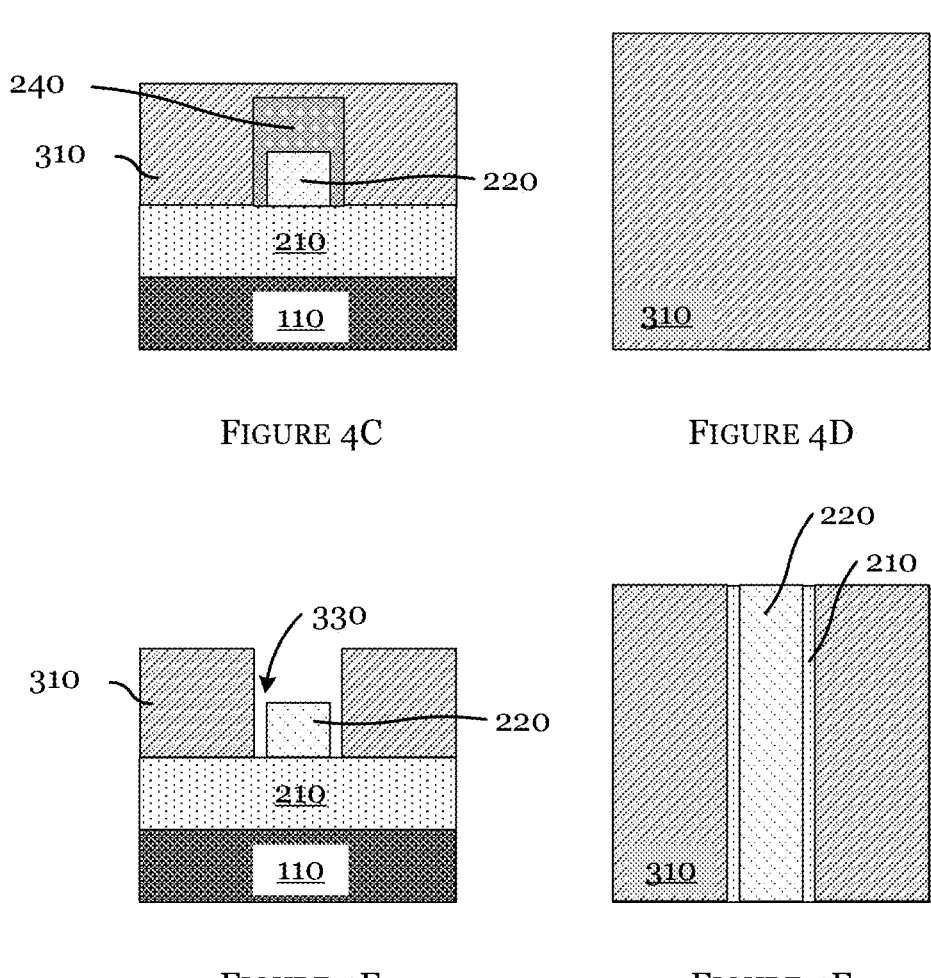
FIGURE 4C FIGURE 4D
FIGURE 4E FIGURE 4F

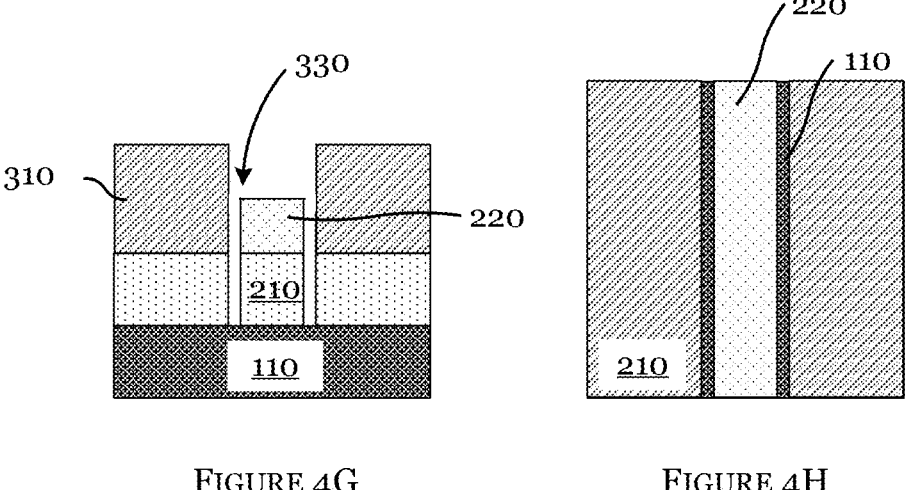
FIGURE 4G                    FIGURE 4H

51

PROCESS FOR FORMING SUB-RESOLUTION FEATURES

EXPOSE PHOTORESIT TO FIRST UV RADIATION — 510

DEVELOP PHOTORESIST — 540

DEPOSIT RESIN — 550

EXPOSE PHOTORESIST TO SECOND UV RADIATION — 520

EXPOSE PHOTORESIST TO SECOND UV RADIATION — 520

DEPOSIT RESIN — 550

DEVELOP PHOTOREST TO FORM SUB-RESOLUTION FEATURES — 530

METHODS OF FORMING PATTERNS

CROSS-REFERENCE TO RELATED APPLICATIONS

This application claims priority to of U.S. Provisional Application No. 63/233,559, filed on Aug. 16, 2021, which application is hereby incorporated herein by reference.

TECHNICAL FIELD

The present invention relates generally to a method of processing a substrate, and, in particular embodiments, to a method of forming patterns.

BACKGROUND

Generally, a semiconductor device, such as an integrated circuit (IC) is fabricated by sequentially depositing and patterning layers of dielectric, conductive, and semiconductor materials over a semiconductor substrate to form a network of electronic components and interconnect elements (e.g., transistors, resistors, capacitors, metal lines, contacts, and vias) integrated in a monolithic structure. At each successive technology node, the minimum feature sizes are shrunk to reduce cost by roughly doubling the component packing density.

Photolithography is a common patterning method in semiconductor fabrication. A photolithography process may start by exposing a coating of photoresist comprising a radiation-sensitive material to a pattern of actinic radiation to define a relief pattern. For example, in the case of positive photoresist, irradiated portions of the photoresist may be dissolved and removed by a developing step using a developing solvent, forming the relief pattern of the photoresist. The relief pattern then may be transferred to a target layer below the photoresist or an underlying hard mask layer formed over the target layer. Innovations on photolithographic techniques may be needed to satisfy the cost and quality requirements for patterning at nanoscale features.

SUMMARY

In accordance with an embodiment of the present invention, a method of forming sub-resolution features that includes: exposing a photoresist layer formed over a substrate to a first ultraviolet light (UV) radiation having a first wavelength of 365 nm or longer through a mask configured to form features at a first critical dimension, the photoresist layer including first portions exposed to the first UV radiation and second portions unexposed to the first UV radiation after exposing with the first UV radiation; exposing the first portions and the second portions to a second UV radiation; and developing the photoresist layer after exposing the photoresist layer to the second UV radiation to form the sub-resolution features having a second critical dimension less than the first critical dimension.

In accordance with an embodiment of the present invention, a method of forming sub-resolution features that includes: exposing a photoresist layer formed over a substrate to a first ultraviolet light (UV) radiation having a first wavelength of 365 nm or longer through a first mask configured to form features at a first critical dimension, the photoresist layer including first portions exposed to the first UV radiation and second portions unexposed to the first UV radiation after exposing with the first UV radiation; developing the photoresist layer after exposing the photoresist layer to the first UV radiation to remove the first portions; depositing a resin over the photoresist layer; and exposing the second portions to a second UV radiation having a second wavelength; developing the photoresist layer after exposing the photoresist layer to the second UV radiation to form the sub-resolution features having a second critical dimension less than the first critical dimension, the sub-resolution features including a trench between the photoresist layer and the resin.

In accordance with an embodiment of the present invention, a lithography tool that includes: a chamber sized and configured to receive a wafer for processing; a wafer holder to hold a 200 mm wafer; a first ultraviolet light (UV) radiation source configured to emit a first UV radiation having a first wavelength of 365 nm, the first UV radiation source configured to form first features having a first critical dimension larger than a first optical resolution limit based on the first UV radiation; a second UV radiation source configured to emit a second UV radiation having a second wavelength, the second UV radiation source configured to form second features having a second critical dimension larger than a second optical resolution limit based on the second UV radiation; where the lithography tool includes instructions to expose a photoresist layer formed over the wafer with the first UV radiation through a first mask configured to form the first features at the first critical dimension, the photoresist layer including first portions exposed to the first UV radiation and second portions unexposed to the first UV radiation; and expose the second portions to the second UV radiation to define sub-resolution features having a critical dimension less than the first optical resolution limit.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2A-2R illustrate a substrate at different stages of a method of forming sub-resolution features comprising spacer patterning in accordance with various embodiments, wherein FIG. 2A illustrates a cross-sectional view of an incoming substrate comprising a photoresist layer, FIG. 2B illustrates a top view of FIG. 2A, FIG. 2C illustrates a cross-sectional view of the substrate after a first exposure to a first ultraviolet (UV) radiation, FIG. 2D illustrates a top view of FIG. 2C, FIG. 2E illustrates a cross-sectional view of the substrate after starting a second exposure to a second ultraviolet (UV) radiation, FIG. 2F illustrates a top view of FIG. 2E, FIG. 2M illustrates a cross-sectional view of the substrate after performing a spacer etch back, FIG. 2N illustrates a top view of FIG. 2M, FIG. 2O illustrates a cross-sectional view of the substrate after performing a pull etch, FIG. 2P illustrates a top view of FIG. 2O, FIG. 2Q illustrates a cross-sectional view of the substrate after performing a pattern transfer etch, and FIG. 2R illustrates a top view of FIG. 2Q, FIGS. 3A-3J illustrate a substrate at different stages of a method of forming sub-resolution features comprising anti-spacer patterning in accordance with an alternate embodiment, wherein FIG. 3G illustrates a cross-sectional view of the substrate after developing to remove the acid-reacted layers, FIG. 3H illustrates a top view of FIG. 3G, FIG. 3I illustrates a cross-sectional view of the substrate after performing a pattern transfer etch, and FIG. 3J illustrates a top view of FIG. 3I, FIGS. 4A-4H illustrate a substrate at different stages of a method of forming sub-resolution features comprising anti-spacer patterning in accordance with yet another embodiment, wherein FIG. 4A illustrates a cross-sectional view of the substrate after a first exposure to a first UV radiation, developing to remove irradiated portions of a photoresist, and a second exposure to a second UV radiation, FIG. 4B illustrates a top view of FIG. 4A, FIG. 4C illustrates a cross-sectional view of the substrate after depositing a resin, FIG. 4D illustrates a top view of FIG. 4C, FIG. 4E illustrates a cross-sectional view of the substrate after developing to remove a top portion of the resin and portions of the photoresist that absorbed the second UV radiation, FIG. 4F illustrates a top view of FIG. 4E, FIG. 4G illustrates a cross-sectional view of the substrate after performing a pattern transfer etch, and FIG. 4H illustrates a top view of FIG. 4G, and FIGS. 5A and 5B illustrate process flow charts of methods of sub-resolution features in accordance with various embodiments, wherein

DETAILED DESCRIPTION OF ILLUSTRATIVE EMBODIMENTS

Figure 1:
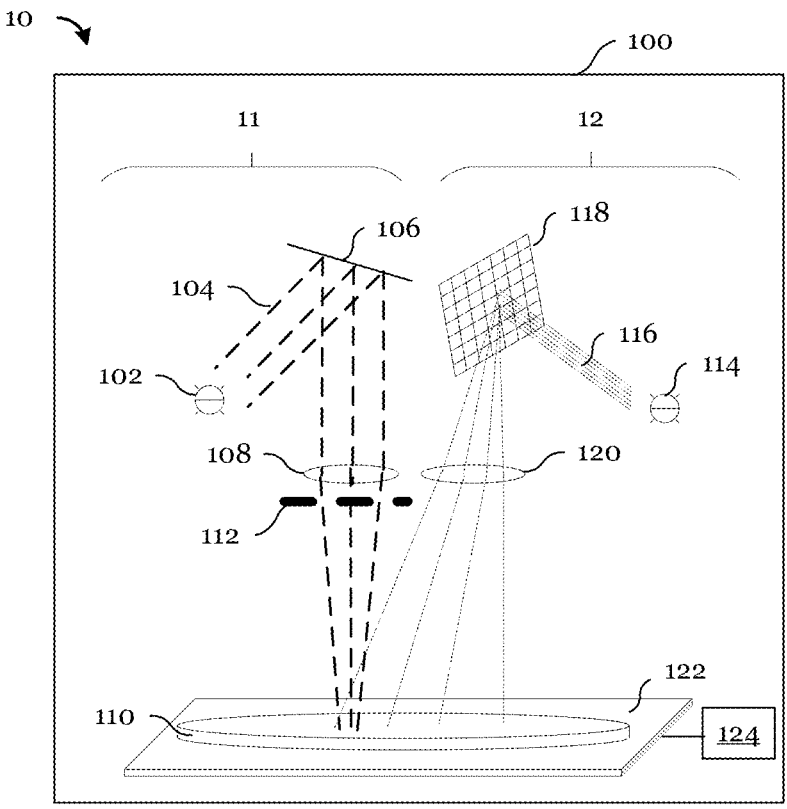
FIG. 1 illustrates an example processing tool comprising a lithography tool and an image projection system for a secondary exposure in accordance with an embodiment.

This application relates to a system and method of patterning sub-resolution features, more particularly to a photolithographic technique using a secondary exposure of an ultraviolet (UV) radiation to shrink feature sizes. With using the secondary exposure, the embodiment methods may advantageously enable patterning features smaller than an optical resolution using a lithography tool with a primary ultraviolet irradiation at 365 nm or higher.

Generally, the minimum feature size for a manufacturable process may be limited by the optical resolution, which depends on a photolithography system. The development of advanced photolithography equipment has continuously improved the optical resolution. For example, deep ultraviolet (DUV) 193 nm immersion photolithography systems can print feature sizes down to about 40 nm. However, such immersion photolithography systems are not available on 200 mm wafer tools or otherwise expensive to retrofit 200 mm wafer flow with such equipment. On the other hand, there are many older equipment with longer wavelength still being used in various applications including 200 mm wafer applications, and there is a long felt need for using such older equipment to produce small features only accessible by high end equipment, for example, features less than 200 nm. As discussed below, various embodiments discussed herein enable forming such features without relying on expensive lithographic techniques such as DUV and immersion in water.

Various embodiments describe methods based on a primary reticle-based exposure to a first ultraviolet (UV) radiation and a secondary exposure to a second UV radiation. In certain embodiments, the first UV radiation may have a wavelength longer than 193 nm, for example, 365 nm (i-line) or longer, advantageously enabling the use of i-line lithography tools or the like (e.g., g-line and h-line). An image projection system may be used for the second exposure to form sub-resolution features by shrinking feature sizes defined by the first reticle-based UV exposure. The sub-resolution features, for example, critical dimensions (CD) less than 200 nm, may be useful in many chips fabricated from 200 mm wafer. Further, even smaller features may be enabled by combining this secondary exposure method with other patterning techniques such as spacer patterning and anti-spacer patterning. In such embodiments, the embodiment methods may also advantageously control an aspect ratio of features by shrinking the height of features.

In the following, an example processing is first illustrated in FIG. 1. A process of a secondary exposure method of forming sub-resolution features coupled with spacer patterning is then described referring to FIGS. 2A-2R. An alternate embodiment method coupled with anti-spacer patterning using acid diffusion is next described referring to FIGS. 3A-3J. Another embodiment coupled with anti-spacer patterning is then described referring to FIGS. 4A-4H. All figures are drawn for illustration purpose only and not to scale.

FIG. 1 illustrates an example processing tool 10 comprising a lithography tool 11 and an image projection system 12 for a second UV exposure in accordance with an embodiment.

In the example embodiment illustrated in FIG. 1, both the lithography tool 11 for a first UV exposure and an image projection system 12 for a second UV exposure are contained in a processing chamber 100, enabling performing the embodiment method continuously without transferring the substrate no from one processing chamber to another. In other embodiments, two UV exposures used in the method of this disclosure may be performed separately in different chambers of a processing tool or in different processing tools.

In FIG. 1, the processing chamber 100 can be sized for receiving a substrate 110. The substrate no may comprise a semiconductor substrate in various embodiments. In certain embodiments, the substrate no may be a 200 mm silicon wafer and the processing chamber 100 may be accordingly sized to house the image projection system 12. The substrate no may be a silicon wafer, or a silicon-on-insulator (SOI) wafer. In certain embodiments, the substrate no may comprise a germanium wafer, silicon germanium wafer, silicon carbide wafer, gallium arsenide wafer, gallium nitride wafer and other compound semiconductors. In other embodiments, the substrate no comprises heterogeneous layers such as silicon germanium on silicon, gallium nitride on silicon, silicon carbon on silicon, as well as layers of silicon on a silicon or SOI substrate. The substrate no may be a reflective or non-reflective silicon wafer with any type of coating.

The semiconductor structure may have undergone a number of steps of processing following, for example, a conventional process. For example, the semiconductor structure may comprise a substrate no in which various device regions are formed. At this stage, the substrate no may include isolation regions such as shallow trench isolation (STI) regions as well as other regions formed therein.

The substrate no may be held by a substrate holder 122. The substrate holder 122 may further be coupled to a substrate alignment system 124 configured to align an image onto a workable area on the substrate 110.

The lithography tool 11 may be a conventional lithography tool without features such as deep ultraviolet (DUV) 193 nm immersion photolithography. In various embodiments, the lithography tool 11 may be a conventional i-line lithography tool configured to fabricate a 200 mm silicon wafer. The lithography tool 11 may comprise a first ultraviolet (UV) light source 102 configured to irradiate a first UV radiation 104 having a first wavelength of 365 nm. In various embodiments, the UV light source 102 may comprise a gas based laser source such as a high pressure mercury vapor lamp or a solid state laser source such as GaN laser. In one or more embodiments, the first wavelength may be greater than 365 nm, for example 405 nm (h-line) or 436 nm (g-line). An optional reflector 106 may be used to align the direction of the first UV radiation 104 depending on the positions of the light source 102 and the substrate no. The first UV radiation 104 may be irradiated through a first lens system 108 and a photomask 112 (a first UV exposure). A reticle may be used as the photomask 112. The first lens system 108 may be a condenser lens system configured to scale down a pattern of the photomask 112 during the first UV exposure. Accordingly, the photomask 112 and the substrate no may not necessarily be in the same scale. In certain embodiments, the photomask 112 may comprise a fused silica plate with a shape of a 6-inch square. The above configuration of the lithography tool 11 is described for example only, and other systems may be used in combination with an image projection system to perform various embodiment methods of this disclosure.

Still referring to FIG. 1, the image projection system 12 includes a light source 114 which can be located within, adjacent to, or remote from the processing chamber 100. The light source 114 may be configured to generate a second UV radiation 116 having a second wavelength. The second wavelength may be selected so that the second UV radiation 116 may have an effect of lithography for a photoresist material used in the method. Accordingly, the second wavelength may be shorter or longer than the first wavelength. Alternately, the first and second wavelengths may be the same. In such an embodiment, the intensity and/or exposure time may be differed to allow the second UV radiation 116 to form sub-resolution features.

In certain embodiments, the light source 114 may comprise an excimer laser such as a argon fluoride (ArF) laser at 193 nm, a krypton fluoride (KrF) laser at 248 nm, a xenon chloride (XeCl) laser at 308 and 459 nm, a xenon fluoride (XeF) laser at 353 and 459 nm, or a helium cadmium (HeCd) laser at 325-442 nm, or a solid state laser such as a Nd-YAG 266 nm laser. In some embodiments, the second wavelength may be 248, 266, or 405 nm, and light sources for these wavelengths may be economically advantageous compared to extreme ultraviolet (EUV) laser sources.

A laser beam can be a collimated high intensity beam to more efficiently heat and treat. Light source characteristics can be tailored to a particular substrate being treated. In one or more embodiments, the second UV radiation 116 may be a blanket radiation pattern that exposes the whole wafer. Alternatively, the second UV radiation 116 may be scanned across the substrate no. The second UV radiation 116 may be spatially controlled by the image projection system 12 to enable fine turning of feature sizes, e.g., to maintain across wafer variations. In certain embodiments, the second UV exposure may be pixel based, where the area of the substrate no to be treated is divided by a grid into multiple cells and conditions of the second UV exposure are individually selected for each cell. The pixel-based second UV exposure may be performing using a light projection device 118 comprising a digital light processing (DLP) chip, grating light valve (GLV), or other light valve technology. A second lens system 120 may be used to produce an image the size of the substrate no onto the substrate no with minimal aberrations. In various embodiments, for example, the image projection system 12 may be capable of a spatial resolution at about 1-2 mm.

Figures 2A, 2B, 2C, 2D, 2E, 2F:
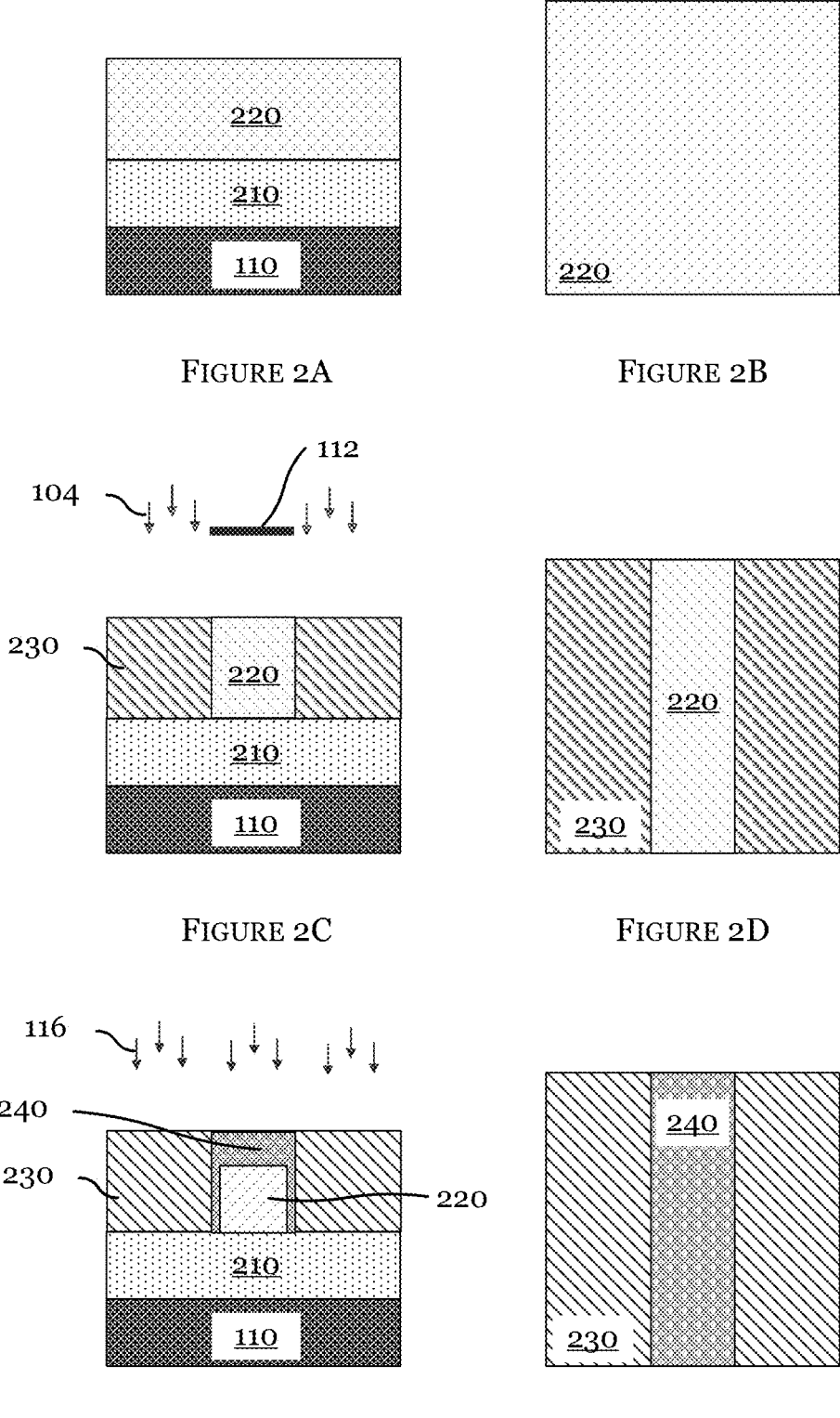

FIGS. 2A-2R illustrate a substrate at different stages of a method of forming sub-resolution features in accordance with various embodiments.

In FIGS. 2A and 2B, a substrate no may comprise an intermediate layer 210 formed over the substrate no. The intermediate layer 210 may be a target for pattern transfer in subsequent processing after photolithography. In various embodiments, the intermediate layer 210 may comprise silicon, silicon oxynitride, organic material, non-organic material, or amorphous carbon. In certain embodiments, the intermediate layer 210 may also be selected to have anti-reflective properties such as by using a silicon bottom anti-reflective coating (Si-BARC). In one or more embodiments, the intermediate layer 210 may be a mask layer comprising a hard mask. The hard mask may comprise silicon nitride, silicon dioxide ($SiO_2$), or titanium nitride. Further, the intermediate layer 210 may be a stacked hard mask comprising, for example, two or more layers using two different materials. A first layer of the hard mask may comprise a metal-based layer such as titanium nitride, titanium, tantalum nitride, tantalum, tungsten based compounds, ruthenium based compounds, or aluminum based compounds, and a second layer of the hard mask may comprise a dielectric layer such as silicon dioxide, silicon nitride, silicon oxynitride, silicon carbide, amorphous silicon, or polycrystalline silicon. The intermediate layer 210 may be deposited using deposition techniques such as vapor deposition including chemical vapor deposition (CVD), physical vapor deposition (PVD), and atomic layer deposition (ALD), as well as other plasma processes such as plasma enhanced CVD (PECVD), sputtering, and other processes.

A layer of a photoresist 220 may be deposited over the intermediate layer 210, e.g., using a coating process or a spin-on process. In various embodiments, the photoresist 220 may comprise a light sensitive organic material, and may be applied from a solution by, for example, a conventional spin coating technique. In some embodiments, the photoresist 220 may comprise a positive tone resist or alternatively a negative tone resist. In certain embodiments, the solution of the photoresist 220 may be dispensed from a dispenser equipped in a processing tool. The photoresist 220 may uniformly cover the entire upper surface of the substrate 110 (FIG. 2B).

FIGS. 2C and 2D illustrate the substrate 110 after a first exposure to the first ultraviolet (UV) radiation 104.

In FIGS. 2C and 2D, in response to the first UV exposure, portions that are exposed to the first UV radiation 104 (first reacted portions 230) are photochemically reacted. In various embodiments, as a result of the first UV exposure, the first reacted portions 230 may be dissolvable in a developing solvent, and may be removed in a later step. As illustrated in FIGS. 2C and 2D, portions of the photoresist 220 that are not exposed to the first UV radiation 104 remains intact and not reacted. In certain embodiments, a post-exposure bake may be performed by thermally treating the substrate 110, for example, a soft bake may be performed in some embodiments. In one or more embodiments, the post-exposure bake may be performed at 80-140° C.

FIGS. 2E and 2F illustrate the substrate 110 after starting a second exposure to a second ultraviolet (UV) radiation.

In FIGS. 2E and 2F, a second UV radiation 116 is irradiated (a second UV exposure) using an image projection system (e.g., the image projection system 12 in FIG. 1). The second UV exposure may photochemically modify the portions of the photoresist 220 that were not exposed during the first UV exposure, forming second reacted portions 240. Chemically, the second reacted portions 240 are similar to the first reacted portions 230 especially when no post exposure bake is performed, however, they are illustrated as different regions for explanation.

In various embodiments, the absorption coefficient of a material irradiated (e.g., the photoresist 220) may be greater in the second UV exposure than in the first UV exposure. In other words, the penetration depth of the second UV radiation 116 into the photoresist 220 is less than the first UV radiation 104. By selecting the wavelength and exposure conditions appropriately, the second UV exposure forms a layer of second reacted portions 240 at the top and sidewalls of the unreacted portions of the photoresist 220. In other words, the second UV exposure is finely tuned to leave some portions of the photoresist 220 unreacted. The layer of the second reacted portions 240 may further be expanded by increasing a dose of the second UV exposure, as described below referring to FIGS. 2G and 2H. The dose may be increased by increasing the light intensity, the exposure time, or both.

Figures 2G, 2H:
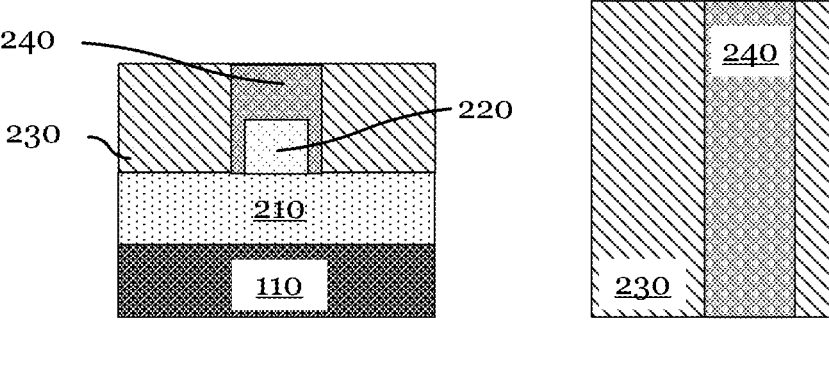
FIG. 2G illustrates a cross-sectional view of the substrate after completing the second UV exposure.
FIG. 2H illustrates a top view of FIG. 2G.

FIGS. 2G and 2H illustrate the substrate no after completing the second UV exposure.

In FIGS. 2G and 2H, the substrate no is exposed to a greater dose of the second UV exposure than FIG. 2E. As a result, the second reacted portions 240 are greater and the unreacted portions of the photoresist 220 is smaller compared with FIG. 2E. Applying the second UV exposure as above may be therefore used to shrink feature sizes defined by the unreacted portions of the photoresist 220 (e.g., compare FIG. 2C and FIG. 2G).

Similar to the first reacted portions 230, the second reacted portions 240 may be dissolvable in a developing solvent, and may be removed in a later step. As further described in detail below with different embodiments, the first reacted portions 230 and the second reacted portions 240 may be removed together in a single development step (e.g., FIGS. 21 and 2J). Alternately, in certain embodiments, more than one development steps may be performed to remove them separately (e.g., FIGS. 3A-3H and FIGS. 4A-4F), enabling various patterning techniques such as spacer/anti-spacer patterning.

In various embodiments, the second UV exposure may be performed as a flood exposure (i.e., a blanket radiation with no pattern). This may be used to achieve shrinking of features across the substrate no uniformly. In other embodiments, the second UV exposure may be performed by a spatially-controlled projection using an image projection system as described above. Although the figures illustrate only a single set of features (e.g., the photoresist 220), different features at different locations on the substrate no may be treated under different conditions (e.g., different doses) of the second UV exposure by the spatially-controlled projection. This may be useful in fine tuning critical dimensions (CD) created by a scanner, stepper, or other reticle-based exposure system (e.g., i-line lithography tool) during the first UV exposure. For example, as the second UV radiation 116 may be scanned across the substrate no, the dose may be varied to account for variations such as across wafer variations. Combining such spatial light projection with lithographic exposure can also achieve significant improvements in CD uniformity (CDU) across a surface of a substrate. In other words, the second UV exposure (e.g., pixel-based) in combination with the first UV exposure (e.g., lithographic reticle-based exposure) can correct feature dimensions that would otherwise be unacceptable or cause defects.

Accordingly, the embodiments of this disclosure may advantageously provide various benefits in relaxing requirements for a lithography tool (e.g., the lithography tool 11 in FIG. 1). For example, the capability of CD correction by the second UV exposure may allow a wider variation in the initial film thickness/surface roughness of a photoresist layer (e.g., the photoresist 220 in FIG. 2A), and a photoresist may be applied in a single step. In conventional methods, multiple chemicals may need to be applied to a substrate to form a photoresist film within an acceptable variation of the film thickness/surface roughness, which may require a greater storage and dispensing capacity of chemicals for the lithography tool. The embodiment methods may allow a lithography tool with a low storage and dispensing capacity of chemicals to be used. Further, only a single chemical may be needed as the requirement for the film thickness uniformity may be eased by the embodiment methods.

A post exposure bake is performed after the second UV radiation 116. The post exposure bake may be common to both the first UV radiation 104 and the second UV radiation 116 in some embodiments.

Figures 2I, 2J:
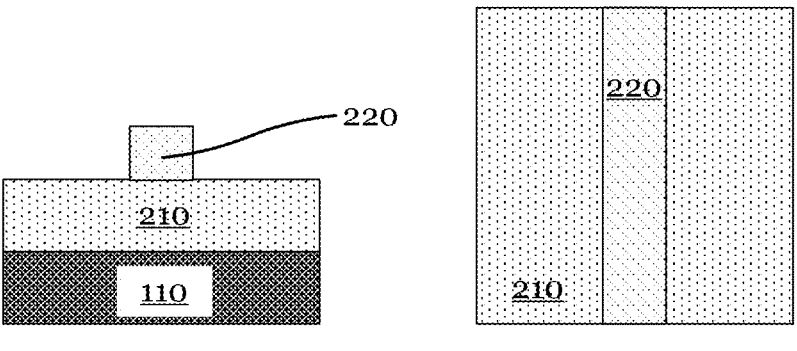
FIG. 2I illustrates a cross-sectional view of the substrate after developing.
FIG. 2J illustrates a top view of FIG. 2I.

FIGS. 21 and 2J illustrate the substrate no after developing.

In FIGS. 21 and 2J, the substrate no is treated by a conventional developing method using a developing solution to remove the first reacted portions 230 and the second reacted portions 240. As a result, the unreacted portions of the photoresist 220 and the intermediate layer 210 are exposed (FIG. 2J). Developing of a photoresist may be performed using a developing solution. In various embodiments, the developing solution may comprise a metal iron free (MIF) developer, for example, an aqueous solution of tetramethylammonium hydroxide (TMAH). In other embodiments, the developing solution may comprise a metal ion containing developer, for example, an aqueous solution of sodium hydroxide (NaOH) or potassium hydroxide (KOH). In various embodiments, owing to the secondary UV exposure, the feature sizes of unreacted portions of the photoresist 220 at this stage may be smaller than optical resolution of a conventional i-line lithography tool (e.g., sub-microns). For example, in certain embodiments, the critical dimension (CD) and the height of unreacted portions of the photoresist 220 may be 200 nm or less. In one embodiment, the secondary exposure may shrink the feature size (e.g., the photoresist 220 in FIG. 2C to FIG. 21) in CD by 40% and in height by 80%. These shrunk feature sizes of the photoresist 220 may be used as a relief pattern for subsequent etching process steps of semiconductor fabrication. The embodiment method enables conventional lithography tools to form sub-resolution features without relying on more expensive lithography tools such as deep ultraviolet (DUV) and/or immersion lithography that are typically available for only 300 mm fabs.

Furthermore, even smaller features, for example, less than 100 nm, may be achieved by the embodiment method that utilizes the sub-resolution features as a mandrel for a subsequent spacer or anti-spacer patterning. For example, spacer patterning may be used to form a narrow line feature, and anti-spacer patterning may be used to form a narrow trench feature. In the following, embodiments comprising spacer/anti-spacer patterning are described referring to FIGS. 2K-2R, 3A-3J, and 4A-4H.

Figures 2K, 2L:
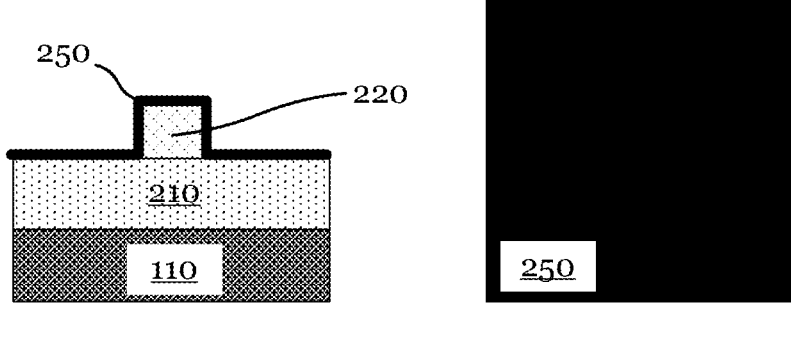
FIG. 2K illustrates a cross-sectional view of the substrate after depositing a spacer material.
FIG. 2L illustrates a top view of FIG. 2K.

FIGS. 2K and 2L illustrate the substrate 110 after depositing a spacer material.

In FIGS. 2K and 2L, a spacer 250 may be deposited over the substrate 110. In various embodiments, the spacer 250 may be deposited using a conformal deposition process such as atomic layer deposition (ALD) or any other conformal deposition technique used within semiconductor device fabrication. The spacer 250 may comprise silicon oxide, silicon nitride, titanium nitride, titanium oxide, or any other type of oxide or insulating material known within the art. In one or more embodiments, the thickness of the spacer 250 is between 5 nm and 10 nm.

FIGS. 2M and 2N illustrate the substrate 110 after performing a spacer etch back.

In FIGS. 2M and 2N, the spacer 250 is etched by an anisotropic etching process, such as reactive ion etch (RIE). In the spacer etch back, the spacer 250 may be removed selectively from the substantially horizontal surfaces comprising the surface of the floor and the top surface of the mandrel (e.g., the remaining photoresist 220), thereby forming sidewall spacers adhering to the near-vertical edges of the mandrel. In various embodiments, the spacer etch back may be timed to expose the top surfaces of the photoresist 220, the intermediate layer 210, or both. Alternatively, the spacer etch back may be stopped at an optional underlying etch stop layer that may be deposited over the intermediate layer 210.

FIGS. 2O and 2P illustrate the substrate 110 after a pull etch to remove the remaining photoresist 220.

In FIGS. 2O and 2P, the remaining photoresist 220 is then removed by the pull etch. In various embodiments, the pull etch may be performed by a conventional wet etching process. Alternately, the pull etch may be performed by an anisotropic plasma etch process, such as reactive ion etch (RIE). In certain embodiments, the spacer etch back (e.g., FIGS. 2M and 2N) and the pull etch (e.g., FIGS. 2O and 2P) may be performed in a single plasma etch chamber. With the mandrel removed, free standing spacers are left behind that may serve as etch/hard mask in a following step to etch an underlying layer (e.g., the intermediate layer 210).

By applying a spacer patterning technique to the sub-resolution feature (e.g., the photoresist 220) enabled by the embodiment method, it is possible to obtain features with smaller pitches and linewidths (e.g., a narrow line feature with a critical dimension (CD) less than 200 nm). Further, the embodiment method based on the second UV exposure to shrink features may provide another benefit of height control. As illustrated in FIGS. 2M and 2O, the height of the spacer 250 may primarily depend on the height of photoresist 220. In a conventional i-line lithography method, the photoresist 220 may have a height of 200 nm to 900 nm. If a spacer is formed on such a thick photoresist, the resulting aspect ratio of the spacer is very high, which will likely cause line wiggling and pattern collapse and hence cannot be used for patterning the intermediate layer 210. In contrast, by reducing the height of the photoresist 220 using embodiments described herein, such pattern collapse can be avoided due to the lower aspect ratio. In other words, applying the second UV exposure to shrink the height of features (e.g., the photoresist 220) according to the embodiment method may overcome this issue by reducing the resulting aspect ratio of the spacer (e.g., the spacer 250). In certain embodiments, the height of the spacer 250 between 20 nm and 150 nm may be obtained. Further, the aspect ratio (the ratio of height over linewidth) of 5 or less may be obtained with the embodiment method.

FIGS. 2Q and 2R illustrate the substrate no after performing a pattern transfer etch.

In FIGS. 2Q and 2R, the intermediate layer 210 is etched with the spacer as an etch mask by an anisotropic etching process, such as reactive ion etch (RIE). The anisotropic etching process transfers the spacer pattern to the intermediate layer 210. In various embodiments, the transferred pattern in the intermediate layer 210 may be formed as part of a multiple patterning process such as self-aligned double patterning (SADP), self-aligned quadruple patterning (SAQP), or any other multiple patterning techniques known within the state of the art. In various embodiments, the transferred pattern may be used to form a contact hole, metal line, gate line, isolation region, and other features useful in semiconductor fabrication.

FIGS. 3A-3J illustrate a substrate at different stages of a method of forming sub-resolution features comprising anti-spacer patterning in accordance with an alternate embodiment. In this embodiment method, an overcoat material and a solubility-changing agent may be used to generate a narrow trench feature with a second exposure to a second UV radiation.

Figures 3A, 3B, 3C, 3D, 3E, 3F:
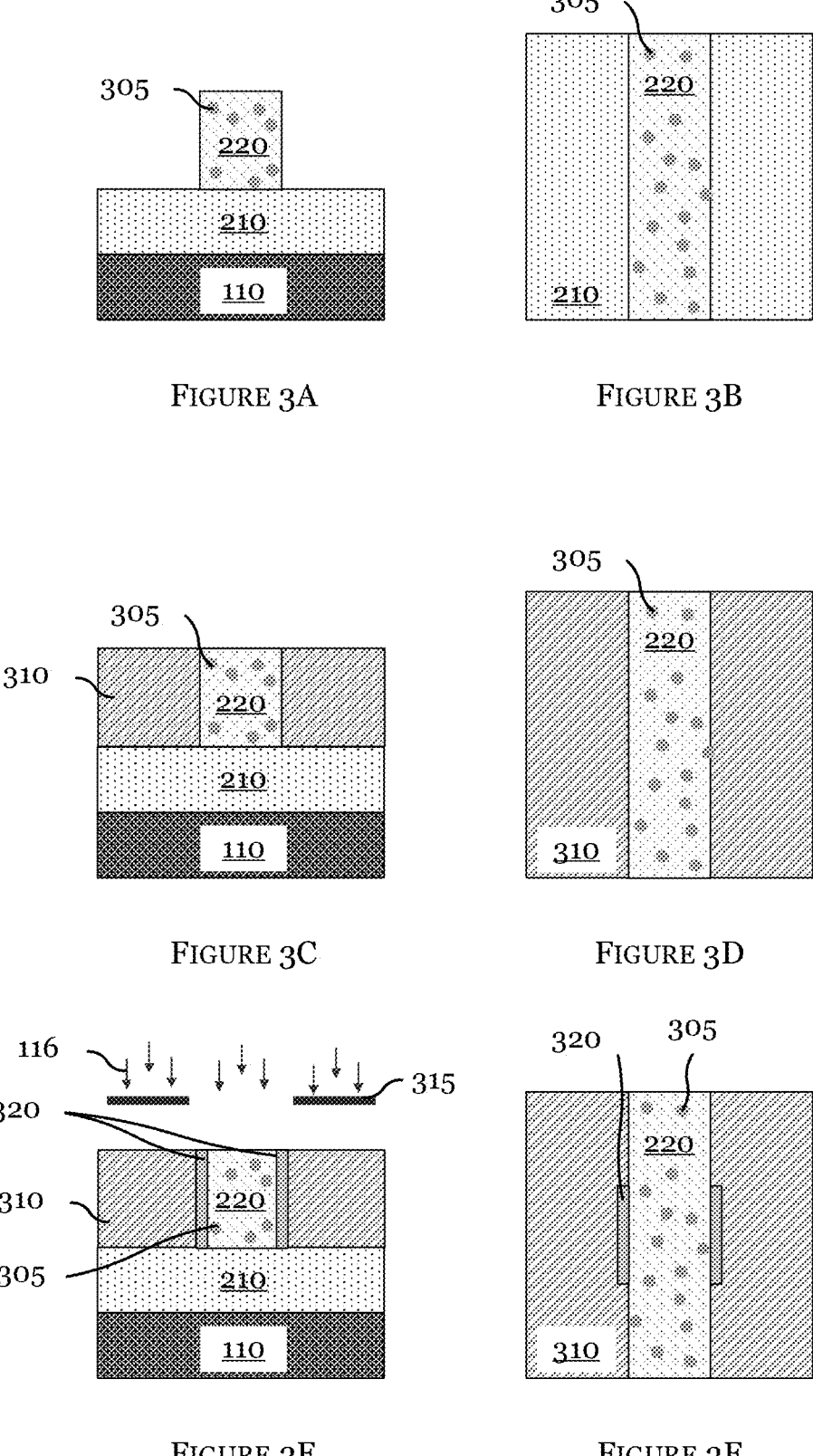
FIG. 3A illustrates a cross-sectional view of the substrate after a first exposure to a first UV radiation followed by developing to remove irradiated portions of a photoresist.
FIG. 3B illustrates a top view of FIG. 3A.
FIG. 3C illustrates a cross-sectional view of the substrate after depositing a resin.
FIG. 3D illustrates a top view of FIG. 3C.
FIG. 3E illustrates a cross-sectional view of the substrate after a second exposure to a second UV radiation to generate an acid and form acid-reacted layers.
FIG. 3F illustrates a top view of FIG. 3E.

FIGS. 3A and 3B illustrate a substrate no after a first exposure to a first UV radiation followed by developing to remove irradiated portions of a photoresist 220.

In FIGS. 3A and 3B, the photoresist 220 formed over the intermediate layer 210 on the substrate no (e.g., FIG. 2A) is patterned by the first UV exposure (e.g., FIG. 2C). Unlike the prior embodiment, instead of a second UV exposure, a developing step may be performed after the first UV exposure and a post exposure bake to remove the first reacted portions (e.g., the first reacted portions 230 in FIG. 2C). The post exposure bake may be performed by heating the substrate no to a temperature between 80 C and 140 C in various embodiments. The developing step may be performed by a conventional developing method as previously described referring to FIG. 2I. As a result, a pattern of the photoresist 220 (e.g., a line) is formed over the intermediate layer 210.

Further illustrated in FIGS. 3A and 3B, the photoresist 220 may comprise a solubility-changing agent 305 for anti-spacer patterning. The solubility-changing agent 305 may comprise a photo acid generator such as a temperature-activated generator or temperature acid generator (TAG). The photo acid generator can be temperature-activated in that heating the solubility-changing agent 305 above a threshold temperature causes photo acid to be generated within the photoresist 220.

FIGS. 3C and 3D illustrate the substrate no after depositing a resin 310.

In FIGS. 3C and 3D, the resin 310 is deposited as an overcoat material over the substrate no. In various embodiments, the resin 310 may be deposited using a coating process or a spin-on process. Although not specifically illustrated, a layer of the resin 310 may cover the top surface of the photoresist 220 in addition to the sidewalls. In various embodiments, the resin 310 may comprise a second photoresist. The resin 310 may be of the same composition as the photoresist 220 or a different composition from the photoresist 220. In some embodiments, the resin 310 may comprise a chemically amplified photoresist. The chemically amplified photoresist may be an acid-catalyzed or base-catalyzed material. In certain embodiments, the resin 310 may include a bottom anti-reflective coating (BARC) material modified to be suitable for a solubility change by acid or base diffusion.

FIGS. 3E and 3F illustrate the substrate no after a second exposure to a second UV radiation 116 to generate an acid and form acid-reacted layers 320.

In FIGS. 3E and 3F, the second UV exposure may be performed using the second UV radiation 116 using the image projection system as described above. In certain embodiments, a second photomask 315 may optionally be used, as illustrated in FIG. 3E. The second photomask 315 may have holes or square openings for forming sub-resolution features that can form contact holes. However, sub-resolution features such as metal lines or gate lines may be formed without using the second photomask 315 in accordance with various embodiments. In response to the second UW exposure, the solubility-changing agent 305 may generate a photo acid in the photoresist 220 and the photo acid diffuses laterally into the resin 310 through the interface between the photoresist 220 and the resin 310. As a result, the acid-reacted layers 320 may be formed from the resin 310 on the sidewalls of the photoresist 220. The photo acid may induce a change in the solubility as it diffuses into the resin 310, where the solubility of the acid-reacted layers 320 is higher in one or more developing solvents than the resin 310 and the photoresist 220. In one or more embodiments, where the layer of the resin 310 covers the top surface of the photoresist 220, the acid-reacted layers 320 may further comprise a lateral portion formed over the top surface of the photoresist 220.

The thickness of the acid-reacted layers 320 may depend on the diffusivity of the photo acid generated. Accordingly, the molecular weight of a photo acid generator may be selected based on a desired diffusivity of the photo acid at a particular temperature. A process temperature may also be controlled to achieve the desired thickness of the acid-reacted layers 320. In certain embodiments, a cross-linking agent may also be used to prevent the photo acid from changing a solubility of the photoresist 220.

Figures 3G, 3H, 3I, 3J:
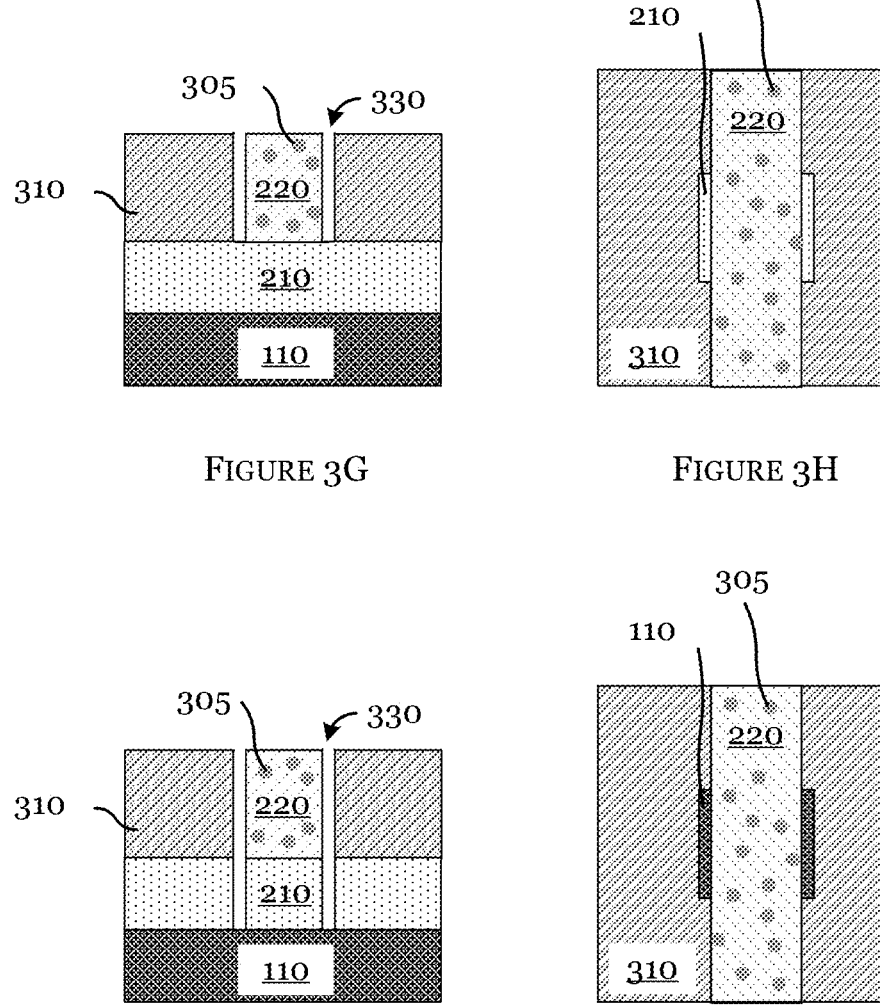

FIGS. 3G and 3H illustrate the substrate no after developing to remove the acid-reacted layers 320.

In FIGS. 3G and 3H, the substrate no is treated by a second developing solvent by a conventional developing method as previously described referring to FIG. 2I. The second developing solvent may have a similar composition as the first developing solvent, but in some embodiments, may have a different composition. After developing, the acid-reacted layers 320 are selectively removed, forming narrow trenches 330 between the sidewalls of the photoresist 220 and the resin 310 as an anti-spacer pattern. The second developing solvent may be selected to have a selectivity to the photoresist 220 and the resin 310.

FIGS. 3I and 3J illustrate the substrate no after performing a pattern transfer etch.

In FIGS. 31 and 3J, the intermediate layer 210 is etched by an anisotropic etching process, such as reactive ion etch (RIE). The anisotropic etching process transfers the anti-spacer pattern (the trenches 330) to the intermediate layer 210. In various embodiments, the transferred pattern may be used to form a contact hole, a via, a metal line, gate line, isolation region, and other features useful in semiconductor fabrication.

FIGS. 4A-4H illustrate a substrate at different stages of a method of forming sub-resolution features comprising anti-spacer patterning in accordance with yet another embodiment.

FIGS. 4A and 4B illustrate a substrate no after a first exposure to a first UV radiation, developing to remove irradiated portions of a photoresist 220, and a second exposure to a second UV radiation 116.

In FIGS. 4A and 4B, the substrate no is treated by several process steps. The photoresist 220 formed over the intermediate layer 210 on the substrate no (e.g., FIG. 2A) is patterned by a first UV exposure (e.g., FIG. 2C). Next, similar to the prior embodiment of anti-spacer patterning (e.g., FIG. 3A), a developing step is performed after the first UV exposure to remove the first reacted portions. Further, the second UV exposure is performed to form second reacted portions 240. Formation of the second reacted portions 240 resembles the prior embodiment of spacer patterning (e.g., FIG. 2E). However, in this embodiment method, the developing step is performed prior to the second UV exposure and therefore the first reacted portions are already removed (e.g., the first reacted portions 230 in FIG. 2E). Consequently, a pattern of the second reacted portions 240 is formed over the intermediate layer 210, where the unreacted portions of the photoresist 220 are embedded inside the second reacted portions 240.

FIGS. 4C and 4D illustrate the substrate no after depositing a resin 310.

In FIGS. 4C and 4D, the resin 310 is deposited as an overcoat material over the substrate 110. The resin 310 may be deposited using a coating process or a spin-on process. In various embodiments, as illustrated in FIGS. 4C and 4D, the resin 310 may be deposited to cover the top surface of the second reacted portions 240. During the deposition process, the height of the resin 310 relative to the second reacted portions 240 may be finely tuned so that a top portion of the resin 310 may be thin enough to be removed by a subsequent developing step and the buried second reacted portions 240 may be exposed.

FIGS. 4E and 4F illustrate the substrate no after developing to remove the top portion of the resin 310 and the second reacted portions 240.

In FIGS. 4E and 4F, the substrate no is treated by a third developing solvent by a conventional developing method as previously described referring to FIG. 2I. The third developing solvent may have a similar composition as the first developing solvent, but in some embodiments, may have a different composition. After developing, the second reacted portions 240 are selectively removed, forming narrow trenches 330 between the sidewalls of the photoresist 220 and the resin 310 as an anti-spacer pattern. The third developing solvent may be selected to have a selectivity to the photoresist 220 and the resin 310.

FIGS. 4G and 4H illustrate the substrate no after performing a pattern transfer etch.

In FIGS. 4I and 4J, the intermediate layer 210 is etched by an anisotropic etching process, such as reactive ion etch (RIE). The anisotropic etching process transfers the anti-spacer pattern (the trenches 330) to the intermediate layer 210. In various embodiments, the transferred pattern may be used to form a contact hole, a via, a metal line, gate line, isolation region, and other features useful in semiconductor fabrication.

Figure 5A:
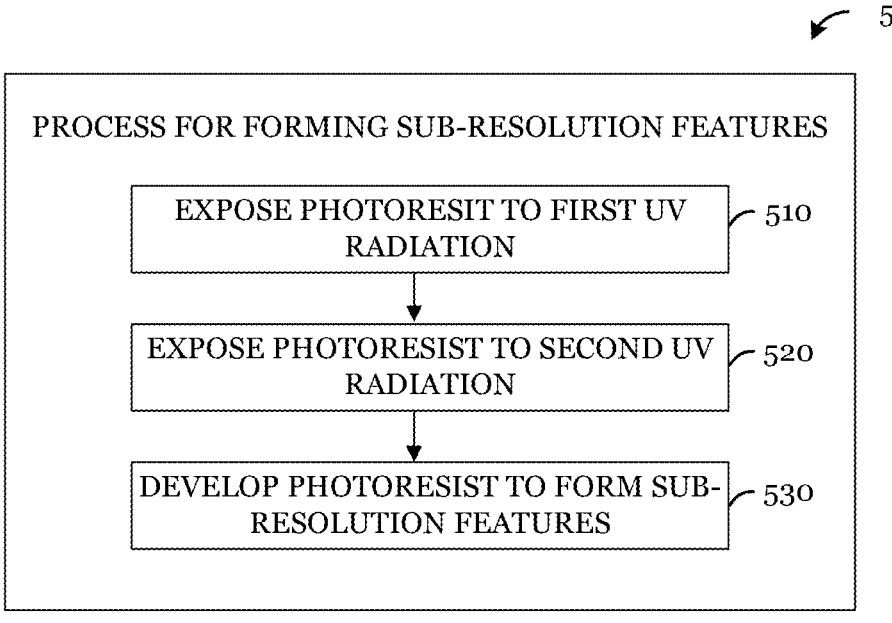
FIG. 5A illustrates an embodiment process flow (e.g., FIGS. 2A-2J)
Figure 5B:
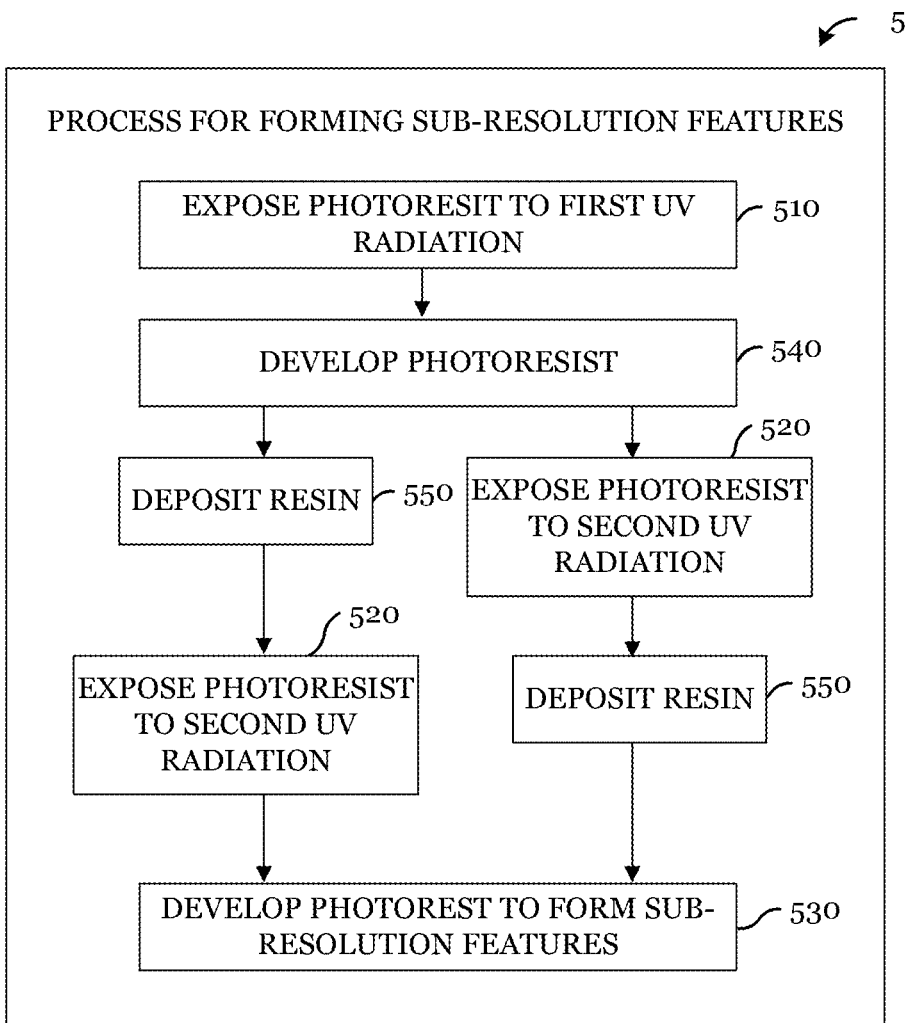
FIG. 5B illustrates alternate embodiment process flows (e.g., FIGS. 3A-3H and FIGS. 4A-4F).

FIGS. 5A and 5B illustrate process flow charts of methods of sub-resolution features in accordance with various embodiments. Example process flows follow in accordance with the embodiments already described above referring to FIGS. 2A-2J, FIGS. 3A-3H, and FIGS. 4A-4F, and therefore the details will not be repeated.

In FIG. 5A, an embodiment process flow 50 is illustrated. First, a photoresist layer formed over a substrate (e.g., the photoresist 220 in FIG. 2A) is exposed to a first ultraviolet light (UV) radiation having a first wavelength of 365 nm or longer through a mask (block 510) (e.g., FIG. 2C) to form features at a first critical dimension. The photoresist is then exposed to a second UV radiation having a second wavelength less than the first wavelength (block 520) (e.g., FIGS. 2E and 2G), shrinking the first critical dimension. Next, the photoresist is developed to form sub-resolution features having a second critical dimension less than the first critical dimension (block 530) (e.g., FIG. 2I). The sub-features formed may further be used as a mandrel for spacer patterning as already described referring to FIGS. 2K-2R.

In FIG. 5B, alternate embodiment process flows 51 comprising anti-spacer patterning (e.g., FIGS. 3A-3H and FIGS. 4A-4F) are illustrated. First, a photoresist layer formed over a substrate (e.g., the photoresist 220 in FIG. 2A) is exposed to a first ultraviolet light (UV) radiation having a first wavelength of 365 nm or longer through a mask (block 510) (e.g., FIG. 2C) to form features at a first critical dimension. Unlike the prior embodiment in FIG. 5A, the photoresist is then developed to remove portions of the photoresist exposed to the first UV radiation (block 540) (e.g., FIG. 3A). In one embodiment, a resin (e.g., the resin 310 in FIG. 3C) is deposited over the photoresist (block 550) (e.g., FIG. 3C), followed by exposing the photoresist to a second UV radiation having a second wavelength (block 520) (e.g., FIG. 3E). Next, the photoresist is developed again to form sub-resolution features (block 530) (e.g., FIG. 3G). The sub-resolution features are trenches (e.g., the trench 330 in FIG. 3G). Alternately, the order of resin deposition and second UV exposure may be switched (e.g., FIGS. 4A-4F). After developing (block 540), the photoresist may be exposed to the second UV radiation (block 520) to shrink the first critical dimension (e.g., FIG. 4A). A resin (e.g., the resin 310 in FIG. 4C) is then deposited over the photoresist (block 550) (e.g., FIG. 4C). Next, the photoresist is developed again to form sub-resolution features (block 530) (e.g., FIG. 4E).

Embodiments of the present application may be applied to form sub-resolution features using conventional lithography tools particularly 200 mm wafer equipment where i-line, g-line, or h-line tools can be modified at low costs to form features not achievable without more expensive technology. For example, using embodiments of this application, applications with isolated short gate length transistors, e.g., less than 40 nm, can be fabricated. An example application of the embodiments described above may include read/write heads for hard disk drive market, where the features are printed and then chemically trimmed down to a target CD.

Example embodiments of the invention are summarized here. Other embodiments can also be understood from the entirety of the specification as well as the claims filed herein.

Example 1. A method of forming sub-resolution features that includes: exposing a photoresist layer formed over a substrate to a first ultraviolet light (UV) radiation having a first wavelength of 365 nm or longer through a mask configured to form features at a first critical dimension, the photoresist layer including first portions exposed to the first UV radiation and second portions unexposed to the first UV radiation after exposing with the first UV radiation; exposing the first portions and the second portions to a second UV radiation; and developing the photoresist layer after exposing the photoresist layer to the second UV radiation to form the sub-resolution features having a second critical dimension less than the first critical dimension.

Example 2. The method of example 1, further including a spacer patterning that includes: depositing a layer of a spacer material over the sub-resolution features; performing a spacer etch back to remove a lateral portion of the spacer material; performing a pull etch to remove the sub-resolution features and form a spacer pattern; and performing a pattern transfer etch using the spacer pattern as an etch mask.

Example 3. The method of one of examples 1 or 2, further including, before developing, performing a post-exposure bake by thermally treating the substrate.

Example 4. The method of one of examples 1 to 3, further including selecting conditions for exposing the first portions and the second portions to the second UV radiation to form the sub-resolution features having a height less than a first height of the features.

Example 5. The method of one of examples 1 to 4, further including selecting conditions for exposing the first portions and the second portions to the second UV radiation to form the sub-resolution features having a width between 200 nm and 360 nm, a height between 20 nm and 900 nm, or a ratio of height to width between 3 and 100.

Example 6. The method of one of examples 1 to 5, where exposing the first portions and the second portions to the second UV radiation is performed using a pixel-based projection system having an array of independently addressable projection points.

Example 7. The method of one of examples 1 to 6, where the first wavelength is 365 nm and the second wavelength is 266 nm.

Example 8. A method of forming sub-resolution features that includes: exposing a photoresist layer formed over a substrate to a first ultraviolet light (UV) radiation having a first wavelength of 365 nm or longer through a first mask configured to form features at a first critical dimension, the photoresist layer including first portions exposed to the first UV radiation and second portions unexposed to the first UV radiation after exposing with the first UV radiation; developing the photoresist layer after exposing the photoresist layer to the first UV radiation to remove the first portions; depositing a resin over the photoresist layer; and exposing the second portions to a second UV radiation having a second wavelength; developing the photoresist layer after exposing the photoresist layer to the second UV radiation to form the sub-resolution features having a second critical dimension less than the first critical dimension, the sub-resolution features including a trench between the photoresist layer and the resin.

Example 9. The method of example 8, where depositing the resin before exposing the second portions to the second UV radiation, the second UV radiation inducing a photochemical reaction generating an acid within the second portions, the acid laterally diffusing into the resin to form acid-reacted layers on side walls of the resin.

Example 10. The method of example 9, where developing the photoresist layer after exposing the photoresist layer to the second UV radiation removes the acid-reacted layers, and where widths of the acid-reacted layers determine the second critical dimension.

Example 11. The method of one of examples 8 to 10, further including, before exposing the second portions to the second UV radiation, inserting a second mask into an optical path of the second UV radiation.

Example 12. The method of example 8, where the resin is deposited over the photoresist layer after exposing the second portions to the second UV radiation, where exposing the second portions includes forming third portions exposed to the second UV radiation by converting a portion of the second portions, the remaining second portions forming fourth portions not being exposed to the second UV radiation.

Example 13. The method of example 12, where the third portions cover sidewalls of the fourth portions.

Example 14. The method of one of examples 12 to 13, where developing the photoresist layer includes removing top portions of the resin to expose the third portions, and removing the third portions.

Example 15. The method of one of examples 8 to 14, further including performing a pattern transfer etch using the sub-resolution features as an anti-spacer.

Example 16. A lithography tool that includes: a chamber sized and configured to receive a wafer for processing; a wafer holder to hold a 200 mm wafer; a first ultraviolet light (UV) radiation source configured to emit a first UV radiation having a first wavelength of 365 nm, the first UV radiation source configured to form first features having a first critical dimension larger than a first optical resolution limit based on the first UV radiation; a second UV radiation source configured to emit a second UV radiation having a second wavelength, the second UV radiation source configured to form second features having a second critical dimension larger than a second optical resolution limit based on the second UV radiation; where the lithography tool includes instructions to expose a photoresist layer formed over the wafer with the first UV radiation through a first mask configured to form the first features at the first critical dimension, the photoresist layer including first portions exposed to the first UV radiation and second portions unexposed to the first UV radiation; and expose the second portions to the second UV radiation to define sub-resolution features having a critical dimension less than the first optical resolution limit.

Example 17. The lithography tool of example 16, further including an image projection system configured to expose the second portions to the second UV radiation.

Example 18. The lithography tool of one of examples 16 or 17, where the image projection system includes a digital light processing (DLP) device or grating light valve (GLV) device.

Example 19. The lithography tool of one of examples 16 to 18, where the image projection system is configured to spatially control the second UV radiation by varying light intensity or light frequency of the second UV radiation.

Example 20. The lithography tool of one of examples 16 to 19, where the critical dimension of the sub-resolution features is less than the second optical resolution limit.

Example 21. The lithography tool of one of examples 16 to 20, further including an instruction to insert a second mask before exposing the second portions to the second UV radiation.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming sub-resolution features, the method comprising:

exposing a photoresist layer formed over a substrate to a first ultraviolet light (UV) radiation having a first wavelength of 365 nm or longer through a mask, the photoresist layer comprising first portions exposed to the first UV radiation and second portions unexposed to the first UV radiation after exposing with the first UV radiation, the second portions having a first height and a first critical dimension;

exposing the first portions and the second portions to a second UV radiation, the second UV radiation being a blanket radiation with no pattern;

forming a plurality of features, the forming comprising developing the photoresist layer after exposing the photoresist layer to the second UV radiation, the plurality of features having a second height and a second critical dimension less than the first critical dimension, the second height being less than the first height; and spacer patterning, the spacer patterning comprising:

depositing a layer of a spacer material over the plurality of features;

performing a spacer etch back to remove a lateral portion of the spacer material;

performing a pull etch to remove the plurality of features and form a spacer pattern; and performing a pattern transfer etch using the spacer pattern as an etch mask.

2. The method of claim 1, further comprising, before developing, performing a post-exposure bake by thermally treating the substrate.

3. The method of claim 1, further comprising selecting conditions for exposing the first portions and the second portions to the second UV radiation to form the sub-resolution wherein the plurality of features have a width between 200 nm and 360 nm, a height between 20 nm and 900 nm, or a ratio of height to width between 3 and 100.

4. The method of claim 1, wherein exposing the first portions and the second portions to the second UV radiation is performed using a pixel-based projection system having an array of independently addressable projection points.

5. The method of claim 1, wherein the first wavelength is 365 nm and the second UV radiation has a wavelength of 266 nm.

6. The method of claim 1, further comprising generating the first UV radiation and the second UV radiation in a common lithography tool.

7. A method of forming sub-resolution features, the method comprising:

exposing a photoresist layer formed over a substrate to a first ultraviolet light (UV) radiation having a first wavelength of 365 nm or longer through a first mask, the photoresist layer comprising first portions exposed to the first UV radiation and second portions unexposed to the first UV radiation after exposing with the first UV radiation, the second portions having a first critical dimension;

developing the photoresist layer after exposing the photoresist layer to the first UV radiation to remove the first portions;

depositing a resin over the photoresist layer;

exposing the second portions to a second UV radiation having a second wavelength; and developing the photoresist layer after exposing the photoresist layer to the second UV radiation to form the sub-resolution features having a second critical dimension less than the first critical dimension, the sub-resolution features comprising a trench between the photoresist layer and the resin.

8. The method of claim 7, wherein depositing the resin before exposing the second portions to the second UV radiation, the second UV radiation inducing a photochemical reaction generating an acid within the second portions, the acid laterally diffusing into the resin to form acid-reacted layers on side walls of the resin.

9. The method of claim 8, wherein developing the photoresist layer after exposing the photoresist layer to the second UV radiation removes the acid-reacted layers, and wherein widths of the acid-reacted layers determine the second critical dimension.

10. The method of claim 8, further comprising, before exposing the second portions to the second UV radiation, inserting a second mask into an optical path of the second UV radiation.

11. The method of claim 7, wherein the resin is deposited over the photoresist layer after exposing the second portions to the second UV radiation, wherein exposing the second portions comprises forming third portions exposed to the second UV radiation by converting a portion of the second portions, the remaining second portions forming fourth portions not being exposed to the second UV radiation.

12. The method of claim 11, wherein the third portions cover sidewalls of the fourth portions.

13. The method of claim 11, wherein developing the photoresist layer comprises removing top portions of the resin to expose the third portions, and removing the third portions.

14. The method of claim 7, further comprising performing a pattern transfer etch using the sub-resolution features as an anti-spacer.

15. A method of forming sub-resolution features, the method comprising:

loading a substrate in a lithography tool, the substrate comprising a photoresist layer formed thereon;

generating, in the lithography tool, a first ultraviolet light (UV) radiation having a first wavelength of 365 nm or longer;

exposing the photoresist layer to the first UV radiation through a single mask, the photoresist layer comprising first reacted portions exposed to the first UV radiation and first unreacted portions unexposed to the first UV radiation after exposing with the first UV radiation, the first unreacted portions having a first height and a first critical dimension;

generating, in the lithography tool, a second UV radiation having a second wavelength;

exposing the photoresist layer to the second UV radiation, the second UV radiation being a blanket radiation with no pattern, the exposing forming, from the first unreacted portions, second reacted portions exposed to the second UV radiation and second unreacted portions unexposed to the second UV radiation after exposing with the second UV radiation, the second unreacted portions having a second height and a second critical dimension less than the first critical dimension, the second height being less than the first height, wherein exposing to the second UV radiation is performed using a pixel-based projection system having an array of independently addressable projection points; and forming a plurality of features, the forming comprising developing the photoresist layer after exposing the photoresist layer to the second UV radiation, the developing removing the first reacted portions and the second reacted portions while retaining the second unreacted portions to form the plurality of features.

16. The method of claim 15, further comprising spacer patterning, the spacer patterning comprising:

depositing a layer of a spacer material over the plurality of features;

performing a spacer etch back to remove a lateral portion of the spacer material;

performing a pull etch to remove the plurality of features and form a spacer pattern; and performing a pattern transfer etch using the spacer pattern as an etch mask.

17. The method of claim 15, further comprising, before developing, performing a post-exposure bake by thermally treating the substrate.

18. The method of claim 15, wherein the plurality of have a width between 200 nm and 360 nm, a height between 20 nm and 900 nm, or a ratio of height to width between 3 and 100.

19. The method of claim 15, wherein the first wavelength is 365 nm and the second wavelength is 266 nm.

\* \* \* \* \*